United States Patent
Hsieh et al.

(10) Patent No.: US 10,109,341 B2
(45) Date of Patent: Oct. 23, 2018

(54) MEMORY CAPABLE OF ENTERING/EXITING POWER DOWN STATE DURING SELF-REFRESH PERIOD AND ASSOCIATED MEMORY CONTROLLER AND MEMORY SYSTEM

(71) Applicant: MEDIATEK Inc., Hsin-Chu (TW)

(72) Inventors: Bo-Wei Hsieh, Tainan (TW); Shang-Pin Chen, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/298,262

(22) Filed: Oct. 20, 2016

(65) Prior Publication Data

US 2017/0133078 A1    May 11, 2017

Related U.S. Application Data (60) Provisional application No. 62/251,551, filed on Nov. 5, 2015.

(51) Int. Cl.
| | | |
|---|---|---|
| *G11C 7/00* | (2006.01) | |
| *G11C 11/4074* | (2006.01) | |
| *G11C 11/406* | (2006.01) | |
| *G11C 11/4076* | (2006.01) | |
| *G11C 11/4072* | (2006.01) | |

(52) U.S. Cl.
CPC ...... *G11C 11/4074* (2013.01); *G11C 11/4072* (2013.01); *G11C 11/4076* (2013.01); *G11C 11/40615* (2013.01); *G11C 2211/4067* (2013.01)

(58) Field of Classification Search
CPC ............ G11C 11/40615; G11C 11/406; G11C 11/4072; G11C 11/4074
See application file for complete search history.

(56) References Cited

U.S. PATENT DOCUMENTS

| | | | | |
|---|---|---|---|---|
| 6,944,708 | B2* | 9/2005 | Frame | G11C 11/406 365/222 |
| 7,457,185 | B2* | 11/2008 | Kim | G11C 11/40618 365/222 |
| 7,610,433 | B2* | 10/2009 | Randell | G06F 11/1068 710/22 |
| 7,613,064 | B1* | 11/2009 | Wagner | G11C 11/406 365/222 |
| 7,729,191 | B2* | 6/2010 | Smith | G11C 7/1066 365/222 |
| 8,193,829 | B2* | 6/2012 | Song | G11O 5/063 326/30 |
| 8,942,056 | B2* | 1/2015 | Ellis | G11C 7/02 365/189.03 |
| 9,053,812 | B2* | 6/2015 | Bains | G11C 11/40615 |

\* cited by examiner

*Primary Examiner* — Viet Q Nguyen
(74) *Attorney, Agent, or Firm* — McClure, Qualey & Rodack, LLP (57) ABSTRACT

A memory controller is connected with a memory. The memory controller includes a clock signal pin and plural command pins. The clock signal pin is connected with the memory for transmitting a clock signal to the memory. The plural command pins are connected with the memory for transmitting a command signal to the memory. The command signal contains an entering self-refresh command and an entering power down command. The memory enters a self-refresh state when the entering self-refresh command is executed. The memory enters a power down state when the entering power down command is executed.

12 Claims, 8 Drawing Sheets

| CMD | | CS | CA0 | CA1 | CA2 | CA3 | CA4 | CA5 | CA6 |
|---|---|---|---|---|---|---|---|---|---|
| SRE | SRE1 | H | L | L | L | L | H | H | H |
| | SRE2 | L | V | V | V | V | V | V | V |
| SRX | SRX1 | H | L | L | L | L | H | H | L |
| | SRX2 | L | V | V | V | V | V | V | V |

| CMD | | CS | CA0 | CA1 | CA2 | CA3 | CA4 | CA5 | CA6 |
|---|---|---|---|---|---|---|---|---|---|
| SRE | SRE1 | H | L | L | L | L | H | H | H |
|  | SRE2 | L | V | V | V | V | V | V | pd_e |
| SRX | SRX1 | H | L | L | L | L | H | H | L |
|  | SRX2 | L | V | V | V | V | V | V | pd_x |

MEMORY CAPABLE OF ENTERING/EXITING POWER DOWN STATE DURING SELF-REFRESH PERIOD AND ASSOCIATED MEMORY CONTROLLER AND MEMORY SYSTEM

This application claims the benefit of U.S. provisional patent application No. 62/251,551, filed Nov. 5, 2015, the subject matter of which is incorporated herein by reference.

FIELD OF THE INVENTION

The invention relates to a memory, and more particularly to a dynamic random access memory (DRAM) capable of entering/exiting a power down state during a self-refresh period and a memory controller and a memory system associated with the memory.

BACKGROUND OF THE INVENTION

Generally, a memory system comprises a memory controller and a dynamic random access memory (DRAM). The memory controller is connected with the DRAM. The memory controller can write data into the DRAM or read data from the DRAM. For example, a double data rate DRAM (also abbreviated as DDR DRAM) is one of the common DRAMs.

Figure 1:
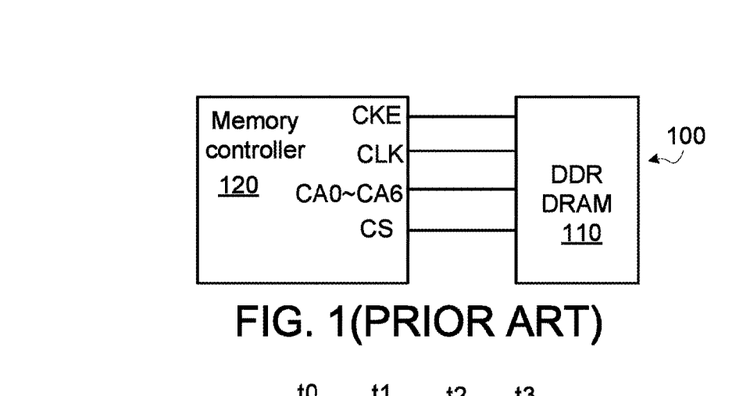
FIG. 1 (prior art) schematically illustrates the architecture of a conventional memory system.

FIG. 1 schematically illustrates the architecture of a conventional memory system. The memory system 100 comprises a memory controller 120 and a DDR DRAM 110. Moreover, plural pins of the memory controller 120 are connected with corresponding pins of the DDR DRAM 110 in order to transmit plural control signals. The DDR DRAM 110 is a low power third generation DDR DRAM (also abbreviated as LPDDR3 DRAM) or a low power fourth generation DDR DRAM (also abbreviated as LPDDR4 DRAM).

As shown in FIG. 1, the control signals include a clock enable signal CKE, a clock signal CLK, a command signal CMD and a chip select signal CS. The command signal CMD at least contains seven command address signals CA0~CA6. That is, 7 pins are employed to transmit the command signal CMD.

The specifications of the LPDDR3 DRAM will be described as follows. For controlling the LPDDR3 DRAM to enter a self-refresh state, the memory controller 120 has to generate an entering self-refresh command SRE. For controlling the LPDDR3 DRAM to exit the self-refresh state, the memory controller 120 has to generate an exiting self-refresh command SRX. Moreover, when the LPDDR3 DRAM enters/exits the self-refresh state, the LPDDR3 DRAM has to enter/exit a power down state. The clock enable signal CKE is employed to control the LPDDR3 DRAM to enter/exit the power down state.

Figure 2A:
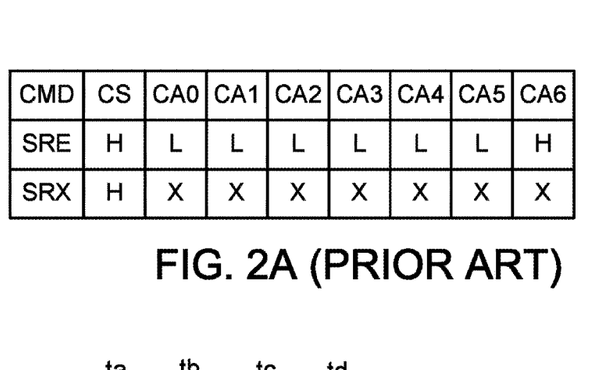
FIG. 2A (prior art) schematically illustrates the contents of an entering self-refresh command SRE and an exiting self-refresh command SRX for controlling the LPDDR3 DRAM.

FIG. 2A schematically illustrates the contents of an entering self-refresh command SRE and an exiting self-refresh command SRX for controlling the LPDDR3 DRAM. In response to the rising edge of the clock signal CLK, the entering self-refresh command SRE indicates that the chip select signal CS is in the high level state (H), the command address signals CA0~CA5 of the command signal CMD are all in the low level state (L) and the command address signal CA6 is in the high level state (H). In response to the rising edge of the clock signal CLK, the exiting self-refresh command SRX indicates that the chip select signal CS is in the high level state (H) and don't care the level states (X) at the command address signals CA0~CA6.

Moreover, another type of the command signal CMD includes a valid command Valid or a no operation command NOP. For example, the valid command Valid is a read command or a write command.

Figure 2B:
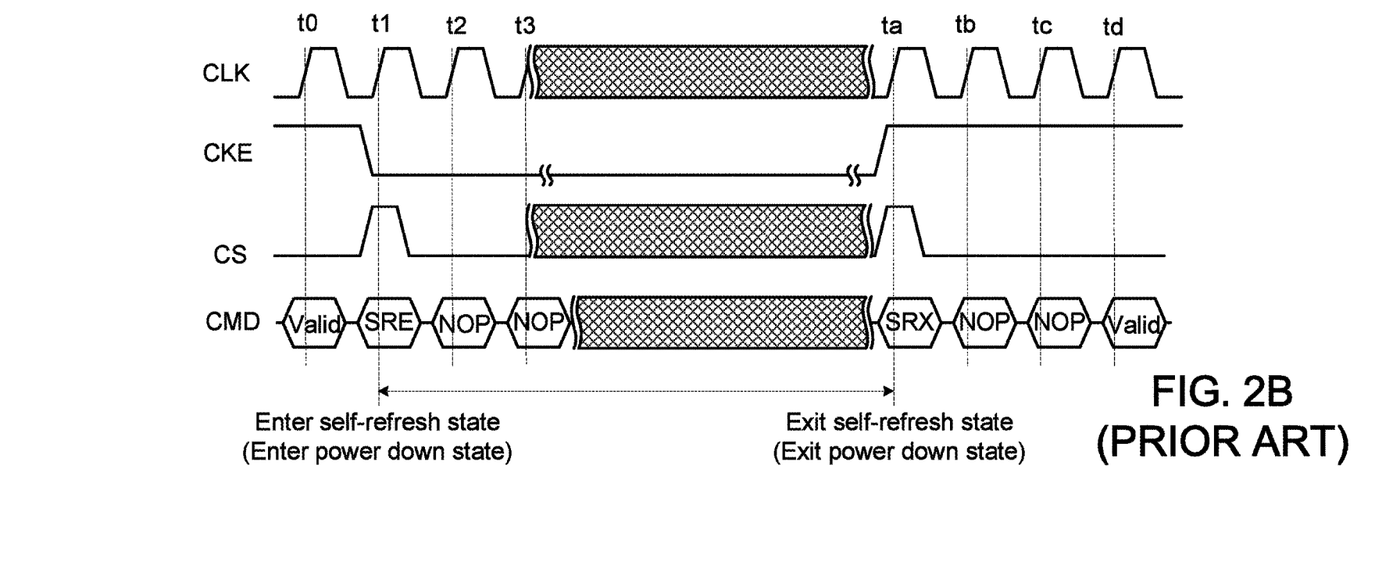
FIG. 2B (prior art) is a schematic timing waveform diagram illustrating associated signals for controlling the LPDDR3 DRAM to enter/exit the self-refresh state.

FIG. 2B is a schematic timing waveform diagram illustrating associated signals for controlling the LPDDR3 DRAM to enter/exit the self-refresh state.

In response to the rising edge of the clock signal CLK at the time point t1, the memory controller 120 generates the entering self-refresh command SRE when the clock enable signal CKE is in the low level state and the chip select signal CS is in the high level state. That is, at the time point t1, the LPDDR3 DRAM enters the self-refresh state and the power down state simultaneously.

In response to the rising edge of the clock signal CLK at the time point ta, the memory controller 120 generates the exiting self-refresh command SRX when the clock enable signal CKE is in the high level state and the chip select signal CS is in the high level state. That is, at the time point ta, the LPDDR3 DRAM exits the self-refresh state and the power down state simultaneously.

As mentioned above, in the time interval between t1 and ta, the self-refresh state of the LPDDR3 DRAM is also the power down state of the LPDDR3 DRAM. Moreover, in the power down state, the memory controller 120 can selectively change the frequency of the clock signal CLK or inactivate the clock signal CLK.

In comparison with the LPDDR3 DRAM, the LPDDR4 DRAM enters/exits the power down state during the self-refresh state. That is, the LPDDR4 DRAM does not have to enter/exit the self-refresh state and the power down state simultaneously. For example, after entering the self-refresh state, the LPDDR4 DRAM enters the power down state. Moreover, after exiting the power down state, the LPDDR4 DRAM exits the self-refresh state.

The specifications of the LPDDR4 DRAM will be described as follows. For controlling the LPDDR4 DRAM to enter a self-refresh state, the memory controller 120 has to generate two consecutive entering self-refresh commands SRE1 and SRE2. For controlling the LPDDR4 DRAM to exit the self-refresh state, the memory controller 120 has to generate two consecutive exiting self-refresh commands SRX1 and SRX2. Moreover, the clock enable signal CKE is employed to control the LPDDR3 DRAM to enter/exit the power down state.

Figure 3A:
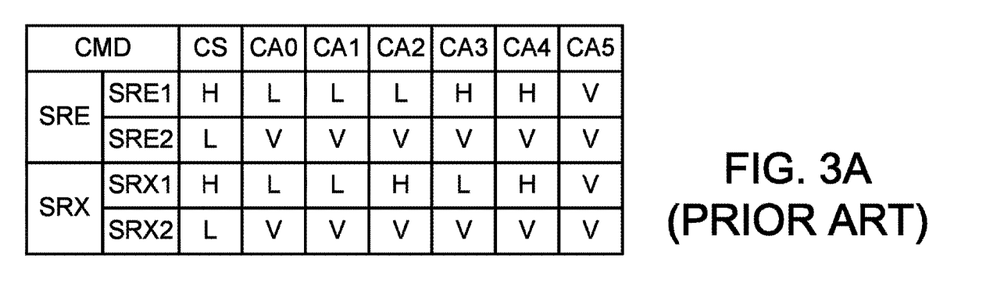
FIG. 3A (prior art) schematically illustrates the contents of an entering self-refresh command SRE and an exiting self-refresh command SRX for controlling the LPDDR4 DRAM.

FIG. 3A schematically illustrates the contents of an entering self-refresh command SRE and an exiting self-refresh command SRX for controlling the LPDDR4 DRAM. In response to a first rising edge of the clock signal CLK, the first entering self-refresh command SRE1 indicates that the chip select signal CS is in the high level state (H), the command address signals CA0~CA2 of the command signal CMD are in the low level state (L), the command address signals CA3~CA4 are in the high level state (H) and the command address signal CA5 is in a valid level state (V). In response to a second rising edge of the clock signal CLK, the second entering self-refresh command SRE2 indicates that the chip select signal CS is in the low level state (L) and the command address signals CA0~CA5 of the command signal CMD are all in the valid level state (V). The valid level state (V) is the low level state (L) or the high level state (H).

In response to a first rising edge of the clock signal CLK, the first exiting self-refresh command SRX1 indicates that the chip select signal CS is in the high level state (H), the command address signals CA0, CA1 and CA3 of the command signal CMD are in the low level state (L), the command address signals CA2 and CA4 are in the high level state (H), and the command address signal CA5 is in a valid level state (V). In response to a second rising edge of the clock signal CLK, the second exiting self-refresh command SRX2 indicates that the chip select signal CS is in the low level state (L) and the command address signals CA0~CA5 of the command signal CMD are all in a valid level state (V).

Similarly, another type of the command signal CMD includes a valid command Valid or a no operation command NOP.

Figure 3B:
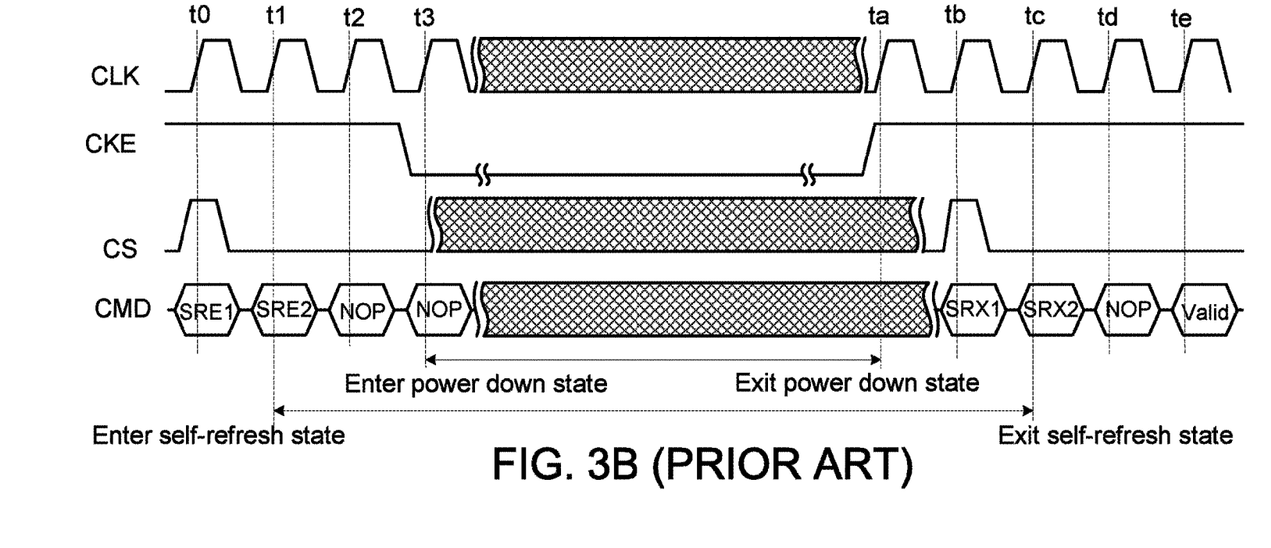
FIG. 3B (prior art) is a schematic timing waveform diagram illustrating associated signals for controlling the LPDDR4 DRAM to enter/exit the self-refresh state.

FIG. 3B is a schematic timing waveform diagram illustrating associated signals for controlling the LPDDR4 DRAM to enter/exit the self-refresh state.

In response to the rising edge of the clock signal CLK at the time point t0, the memory controller 120 generates the first entering self-refresh command SRE1 when the clock enable signal CKE is in the high level state and the chip select signal CS is in the high level state. Then, in response to the rising edge of the clock signal CLK at the time point t1, the memory controller 120 generates the second entering self-refresh command SRE2 when the clock enable signal CKE is in the high level state and the chip select signal CS is in the low level state. That is, at the time point t1, the LPDDR4 DRAM enters the self-refresh state.

In response to the rising edge of the clock signal CLK at the time point t3, the clock enable signal CKE from the memory controller 120 is in the low level state. That is, at the time point t3, the LPDDR4 DRAM enters the power down state. Similarly, in the power down state, the memory controller 120 can selectively change the frequency of the clock signal CLK or inactivate the clock signal CLK.

In response to the rising edge of the clock signal CLK at the time point ta, the clock enable signal CKE from the memory controller 120 is in the high level state. That is, at the time point ta, the LPDDR4 DRAM exits the power down state.

In response to the rising edge of the clock signal CLK at the time point tb, the memory controller 120 generates the first exiting self-refresh command SRX1 when the clock enable signal CKE is in the high level state and the chip select signal CS is in the high level state. Then, in response to the rising edge of the clock signal CLK at the time point tc, the memory controller 120 generates the second exiting self-refresh command SRX2 when the clock enable signal CKE is in the high level state and the chip select signal CS is in the low level state. That is, at the time point tc, the LPDDR4 DRAM exits the self-refresh state.

As mentioned above, the LPDDR4 DRAM is in the self-refresh state in the time interval between t1 and tc, and the LPDDR4 DRAM is in the power down state in the time interval between t3 and ta.

In accordance with another conventional method, the clock enable signal CKE is in the low level state at the time point t1 and in the high level state at the time point tc. Consequently, the LPDDR4 DRAM is in the self-refresh state and the power down state simultaneously.

However, a new DDR DRAM maybe introduced into the market. The new DDR DRAM has a new DRAM interface without the clock enable signal CKE pin to transmit the clock enable signal CKE. In other words, the new DDR DRAM cannot enter/exit the power down state according to the clock enable signal CKE.

SUMMARY OF THE INVENTION

An object of the invention provides a memory capable of entering/exiting a power down state during a self-refresh period without using a CKE pin, and also provides a memory controller and a memory system associated with the memory.

An embodiment of the invention provides a memory controller. The memory controller is connected with a memory. The memory controller includes a clock signal pin and plural command pins. The clock signal pin is connected with the memory for transmitting a clock signal to the memory. The plural command pins are connected with the memory for transmitting a command signal to the memory. The command signal contains an entering self-refresh command and an entering power down command. The memory enters a self-refresh state when the entering self-refresh command is executed. The memory enters a power down state when the entering power down command is executed.

Another embodiment of the invention provides an embodiment of the invention provides a memory controller. The memory controller is connected with a memory. The memory controller includes a clock signal pin and plural command pins. The clock signal pin is connected with the memory for transmitting a clock signal to the memory. The plural command pins are connected with the memory for transmitting a command signal to the memory. The command signal contains an entering self-refresh command. When the entering self-refresh command is executed, the memory enters a self-refresh state and the memory selectively enters a power down state according to a setting of a power down entry bit.

Another embodiment of the invention provides a memory. The memory is connected with a memory controller. The memory includes a clock signal pin and plural command pins. The memory includes a clock signal pin and plural command pins. The clock signal pin is connected with the memory controller for receiving a clock signal from the memory controller. The plural command pins are connected with the memory controller for receiving a command signal from the memory controller. The command signal contains an entering self-refresh command and an entering power down command. The memory enters a self-refresh state when the entering self-refresh command is executed. The memory enters a power down state when the entering power down command is executed.

Another embodiment of the invention provides a memory. The memory is connected with a memory controller. The memory includes a clock signal pin and plural command pins. The memory includes a clock signal pin and plural command pins. The clock signal pin is connected with the memory controller for receiving a clock signal from the memory controller. The plural command pins are connected with the memory controller for receiving a command signal from the memory controller. The command signal contains an entering self-refresh command. When the entering self-refresh command is executed, the memory enters a self-refresh state and the memory selectively enters a power down state according to a setting of a power down entry bit.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

The novel dynamic random access memory has a new DDR DRAM interface without the clock enable signal CKE pin. In other words, the new DDR DRAM cannot enter/exit the power down state according to the clock enable signal CKE. The invention provides a memory capable of entering/exiting a power down state during a self-refresh period without using the CKE pin. The invention also provides a memory controller and a memory system associated with the memory.

Figure 4:
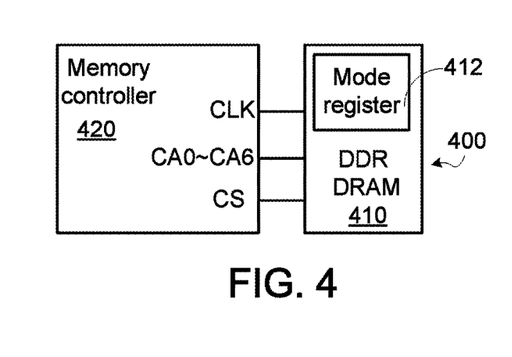
FIG. 4 schematically illustrates the architecture of a memory system according to an embodiment of the invention.

FIG. 4 schematically illustrates the architecture of a memory system according to an embodiment of the invention. As shown in FIG. 4, the memory system 400 comprises a memory controller 420 and a DDR DRAM 410. Moreover, plural pins of the memory controller 420 and corresponding pins of the DDR DRAM 410 are connected with each other to transmit plural control signals. In an embodiment, the DDR DRAM 410 is the new DDR DRAM without the clock enable signal CKE pin. Moreover, the DDR DRAM 410 further comprises a mode register 412.

As shown in FIG. 4, the control signals include a clock signal CLK, a command signal CMD and a chip select signal CS. The command signal CMD at least contains seven command address signals CA0~CA6. That is, at least 7 pins are employed to transmit the command signal CMD.

For controlling the DDR DRAM 410 to enter a self-refresh state, the memory controller 420 generates two consecutive entering self-refresh commands SRE1 and SRE2. For controlling the DDR DRAM 410 to exit the self-refresh state, the memory controller 420 generates two consecutive exiting self-refresh commands SRX1 and SRX2. It is noted that numerous modifications and alterations may be made while retaining the teachings of the invention. For example, in another embodiment, the memory controller 420 generates an entering self-refresh command and an exiting self-refresh command to control the DDR DRAM 410 to enter/exit the self-refresh state.

Figure 5A:
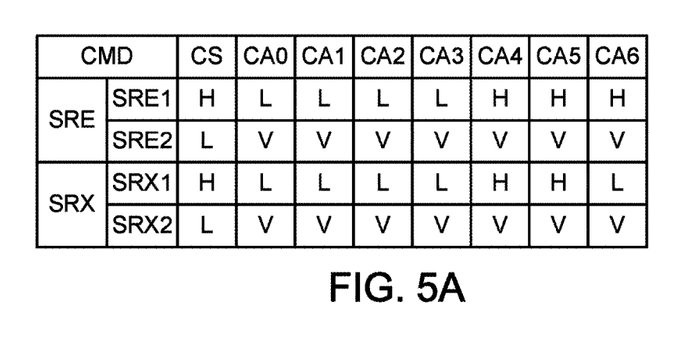
FIG. 5A schematically illustrates the contents of an entering self-refresh command SRE and an exiting self-refresh command SRX for controlling the DDR DRAM according to the embodiment of the invention.

FIG. 5A schematically illustrates the contents of an entering self-refresh command SRE and an exiting self-refresh command SRX for controlling the DDR DRAM according to the embodiment of the invention. In response to a first rising edge of the clock signal CLK, the first entering self-refresh command SRE1 indicates that the chip select signal CS is in the high level state (H), the command address signals CA0~CA3 of the command signal CMD are in the low level state (L) and the command address signals CA4~CA6 are in the high level state (H). In response to a second rising edge of the clock signal CLK, the second entering self-refresh command SRE2 indicates that the chip select signal CS is in the low level state (L) and the command address signals CA0~CA6 of the command signal CMD are all in the valid level state (V). The valid level state (V) is the low level state (L) or the high level state (H).

In response to a first rising edge of the clock signal CLK, the first exiting self-refresh command SRX1 indicates that the chip select signal CS is in the high level state (H), the command address signals CA0~CA3 and CA6 of the command signal CMD are in the low level state (L) and the command address signals CA4~CA5 are in the high level state (H). In response to a second rising edge of the clock signal CLK, the second exiting self-refresh command SRX2 indicates that the chip select signal CS is in the low level state (L) and the command address signals CA0~CA6 of the command signal CMD are all in the valid level state (V).

Similarly, another type of the command signal CMD includes a valid command Valid or a no operation command NOP.

Figure 5B:
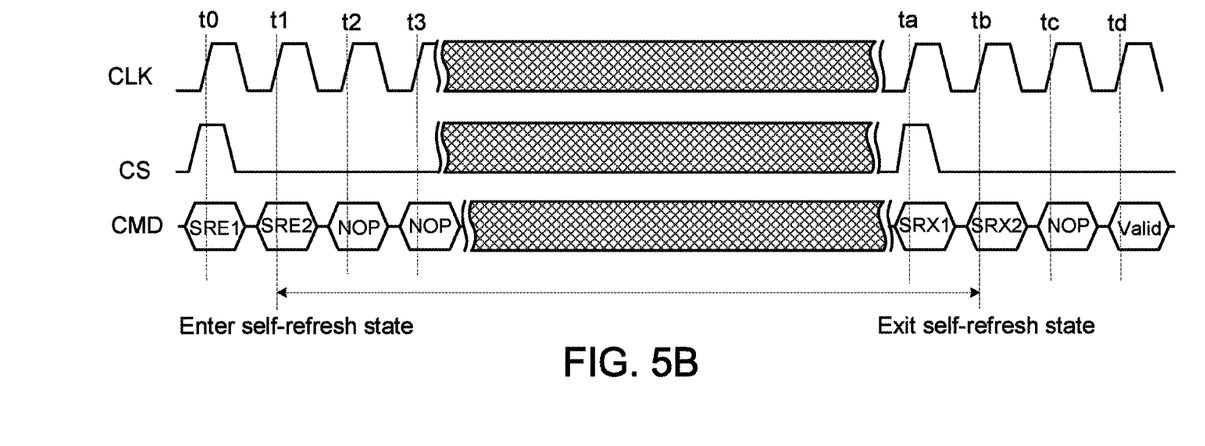
FIG. 5B is a schematic timing waveform diagram illustrating associated signals for controlling the DDR DRAM to enter/exit the self-refresh state according to the embodiment of the invention.

FIG. 5B is a schematic timing waveform diagram illustrating associated signals for controlling the DDR DRAM to enter/exit the self-refresh state according to the embodiment of the invention.

In response to the rising edge of the clock signal CLK at the time point t0, the memory controller 420 generates the first entering self-refresh command SRE1 when the chip select signal CS is in the high level state. The, in response to the rising edge of the clock signal CLK at the time point t1, the memory controller 420 generates the second entering self-refresh command SRE2 when the chip select signal CS is in the low level state. That is, at the time point t1, the DDR DRAM 410 enters the self-refresh state.

In response to the rising edge of the clock signal CLK at the time point ta, the memory controller 420 generates the first exiting self-refresh command SRX1 when the chip select signal CS is in the high level state. Then, in response to the rising edge of the clock signal CLK at the time point tb, the memory controller 420 generates the second exiting self-refresh command SRX2 when the chip select signal CS is in the low level state. That is, at the time point tb, the DDR DRAM 410 exits the self-refresh state.

As mentioned above, the DDR DRAM 410 is in the self-refresh state in the time interval between t1 and tb. In this context, the time interval when the DDR DRAM 410 is in the self-refresh state is referred as the self-refresh period.

The DDR DRAM 410 has no pin for transmitting the clock enable signal CKE. The invention provides various methods for controlling the DDR DRAM 410 to enter/exit the power down state. These methods will be described as follows.

Figure 6A:
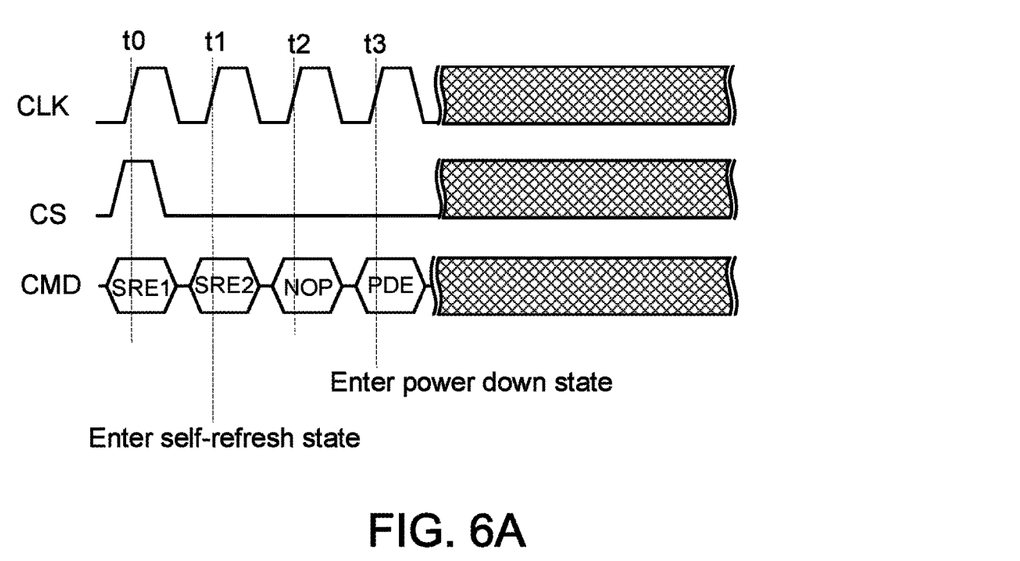
FIGS. 6A and 6B are schematic timing waveform diagrams illustrating associated signals for controlling the DDR DRAM to enter/exit the power down state according to a first embodiment of the invention.
Figure 6B:
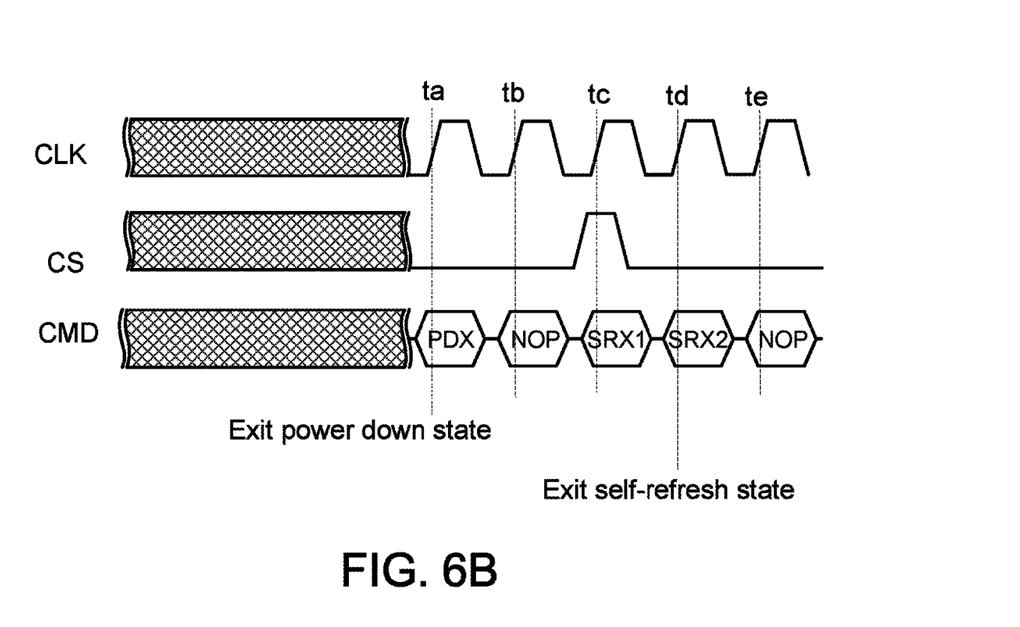

FIGS. 6A and 6B are schematic timing waveform diagrams illustrating associated signals for controlling the DDR DRAM to enter/exit the power down state according to a first embodiment of the invention. The command signal CMD further contains an entering power down command PDE and an exiting power down command PDX. The memory controller 420 controls the DDR DRAM 410 to enter/exit the power down state during the self-refresh period according to the entering power down command PDE and the exiting power down command PDX. Moreover, the contents of the entering self-refresh command SRE and the exiting self-refresh command SRX for controlling the DDR DRAM are identical to those of FIG. 5A, and are not redundantly described herein.

Please refer to FIG. 6A. In response to the rising edge of the clock signal CLK at the time point t0, the memory controller 420 generates the first entering self-refresh command SRE1 when the chip select signal CS is in the high level state. Then, in response to the rising edge of the clock signal CLK at the time point t1, the memory controller 420 generates the second entering self-refresh command SRE2 when the chip select signal CS is in the low level state. That is, at the time point t1, the DDR DRAM 410 enters the self-refresh state.

Moreover, in response to the rising edge of the clock signal CLK at the time point t3, the memory controller 420 generates the entering power down command PDE. That is, at the time point t3, the DDR DRAM 410 enters the power down state. Moreover, in the power down state, the memory controller 420 can selectively change the frequency of the clock signal CLK or inactivate the clock signal CLK.

Please refer to FIG. 6B. In response to the rising edge of the clock signal CLK at the time point ta, the memory controller 420 generates the exiting power down command PDX. That is, at the time point ta, the DDR DRAM 410 exits the power down state. Consequently, in the time interval between t3 and ta, the DDR DRAM 410 is in the power down state.

Moreover, in response to the rising edge of the clock signal CLK at the time point tc, the memory controller 420 generates the first exiting self-refresh command SRX1 when the chip select signal CS is in the high level state. Then, in response to the rising edge of the clock signal CLK at the time point td, the memory controller 420 generates the second exiting self-refresh command SRX2 when the chip select signal CS is in the low level state. That is, at the time point td, the DDR DRAM 410 exits the self-refresh state. Consequently, the DDR DRAM 410 is in the self-refresh state in the time interval between t1 and td. Moreover, the time interval when the DDR DRAM 410 is in the self-refresh state is referred as the self-refresh period.

Figure 7A:
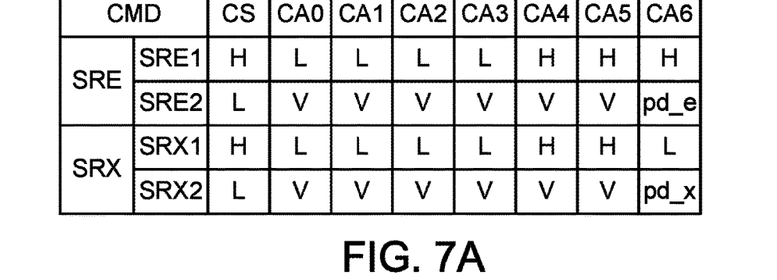
FIG. 7A schematically illustrates the contents of an entering self-refresh command SRE and an exiting self-refresh command SRX for controlling the DDR DRAM according to another embodiment of the invention.
Figure 7B:
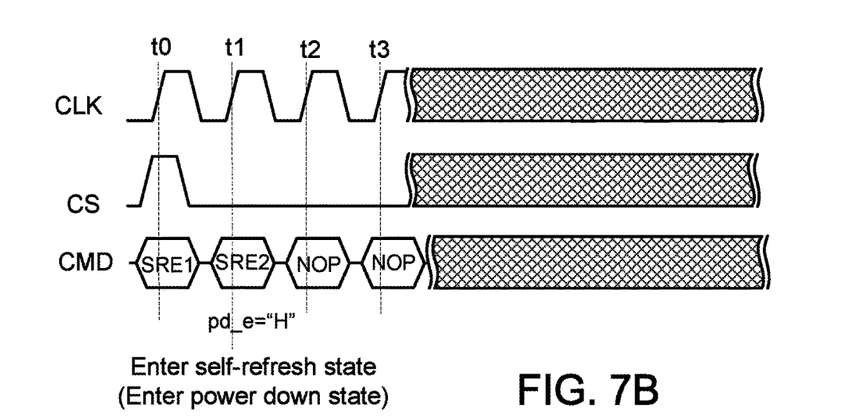
FIGS. 7B and 7C are schematic timing waveform diagrams illustrating associated signals for controlling the DDR DRAM to enter/exit the power down state according to a second embodiment of the invention.
Figure 7C:
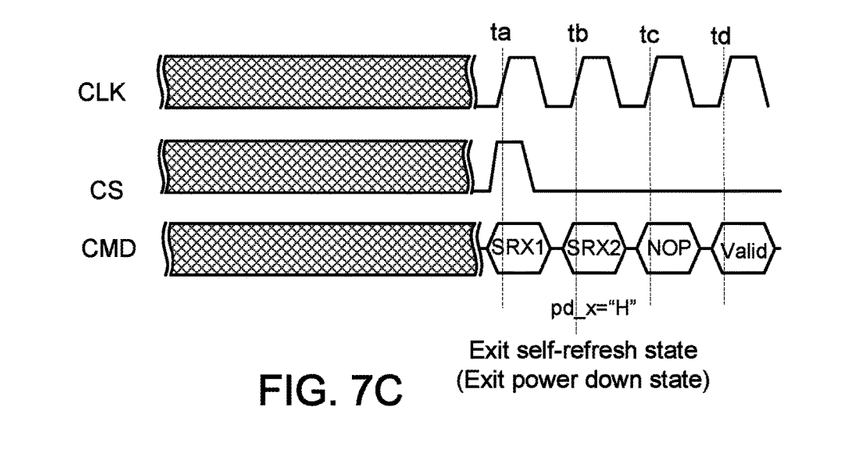

FIG. 7A schematically illustrates the contents of an entering self-refresh command SRE and an exiting self-refresh command SRX for controlling the DDR DRAM according to another embodiment of the invention. FIGS. 7B and 7C are schematic timing waveform diagrams illustrating associated signals for controlling the DDR DRAM to enter/exit the power down state according to a second embodiment of the invention. In comparison with FIG. 5A, the contents of the entering self-refresh command SRE and the exiting self-refresh command SRX in the command signal CMD of this embodiment are distinguished.

As shown in FIG. 7A, the command address signal CA6 of the second entering self-refresh command SRE2 is modified into a power down entry bit pd_e. In case that the power down entry bit pd_e is set as the high level state, the DDR DRAM 410 enters the self-refresh state and the power down state simultaneously when the second entering self-refresh command SRE2 is executed. In case that the power down entry bit pd_e is set as the low level state, the DDR DRAM 410 enters the self-refresh state but does not enter the power down state when the second entering self-refresh command SRE2 is executed.

Moreover, the command address signal CA6 of the second exiting self-refresh command SRX2 is modified into a power down exit bit pd_x. In case that the power down exit bit pd_x is set as the high level state, the DDR DRAM 410 exits the self-refresh state and the power down state simultaneously when the second exiting self-refresh command SRX2 is executed. In case that the power down exit bit pd_x is set as the low level state, the DDR DRAM 410 exits the self-refresh state but does not exit the power down state when the second exiting self-refresh command SRX2 is executed.

Please refer to FIG. 7B. In response to the rising edge of the clock signal CLK at the time point t0, the memory controller 420 generates the first entering self-refresh command SRE1 when the chip select signal CS is in the high level state. Then, in response to the rising edge of the clock signal CLK at the time point t1, the memory controller 420 generates the second entering self-refresh command SRE2 when the chip select signal CS is in the low level state. Since the power down entry bit pd_e is set as the high level state, the DDR DRAM 410 enters the self-refresh state and the power down state simultaneously at the time point t1.

Please refer to FIG. 7C. In response to the rising edge of the clock signal CLK at the time point ta, the memory controller 420 generates the first exiting self-refresh command SRX1 when the chip select signal CS is in the high level state. Then, in response to the rising edge of the clock signal CLK at the time point tb, the memory controller 420 generates the second exiting self-refresh command SRX2 when the chip select signal CS is in the low level state. Since the power down exit bit pd_x is set as the high level state, the DDR DRAM 410 exits the self-refresh state and the power down state simultaneously at the time point tb.

As mentioned above, the DDR DRAM 410 is in the self-refresh state and the power down state in the time interval between t1 and tb.

In this embodiment, the DDR DRAM 410 determines whether a power down entry operation is performed according to the power down entry bit pd_e during execution of the entering self-refresh command SRE. Moreover, the DDR DRAM 410 determines whether a power down exit operation is performed according to the power down exit bit pd_x during execution of the exiting self-refresh command SRX. Under this circumstance, it is not necessary to execute the entering power down command PDE and the exiting power down command PDX.

In this embodiment, the power down entry bit pd_e and the power down exit bit pd_x are defined in the command address signal CA6. In some other embodiments, the power down entry bit pd_e and the power down exit bit pd_x are defined in another command address signal.

In the above embodiment, the power down entry bit pd_e and the power down exit bit pd_x are defined in the entering self-refresh command SRE and the exiting self-refresh command SRX of the command signal CMD. In some other embodiments, the power down entry bit pd_e and the power down exit bit pd_x are defined in the mode register 412 of the DDR DRAM 410.

For example, in case that the power down entry bit pd_e and the power down exit bit pd_x are defined in the mode register 412 of the DDR DRAM 410, the power down entry bit pd_e and the power down exit bit pd_x can be set by the memory controller 420.

While the second entering self-refresh command SRE2 is executes, the DDR DRAM 410 checks the power down entry bit pd_e in the mode register 412. If the power down entry bit pd_e is in the high level state, the DDR DRAM 410 enters the self-refresh state and the power down state simultaneously. Whereas, if the power down exit bit pd_x is in the low level state, the DDR DRAM 410 exits the self-refresh state but does not exit the power down state.

Similarly, while the second exiting self-refresh command SRX2 is executed, the DDR DRAM 410 checks the power down exit bit pd_x in the mode register 412. If the power down exit bit pd_x is in the high level state, the DDR DRAM 410 exits the self-refresh state and the power down state simultaneously. Whereas, if the power down exit bit pd_x is in the low level state, the DDR DRAM 410 exits the self-refresh state but does not exit the power down state.

In case that the power down entry bit pd_e and the power down exit bit pd_x are defined in the mode register 412 of the DDR DRAM 410, the timing waveforms of the associated signals for controlling the DDR DRAM 410 to enter/exit the power down state are similar to those of FIGS. 7B and 7C.

The above methods of for controlling the DDR DRAM 410 to enter/exit the power down state may be combined with each other. Consequently, the DDR DRAM 410 can enter/exit the power down state during the self-refresh period in diversified manner. Some examples will be illustrated as follows.

Figure 8A:
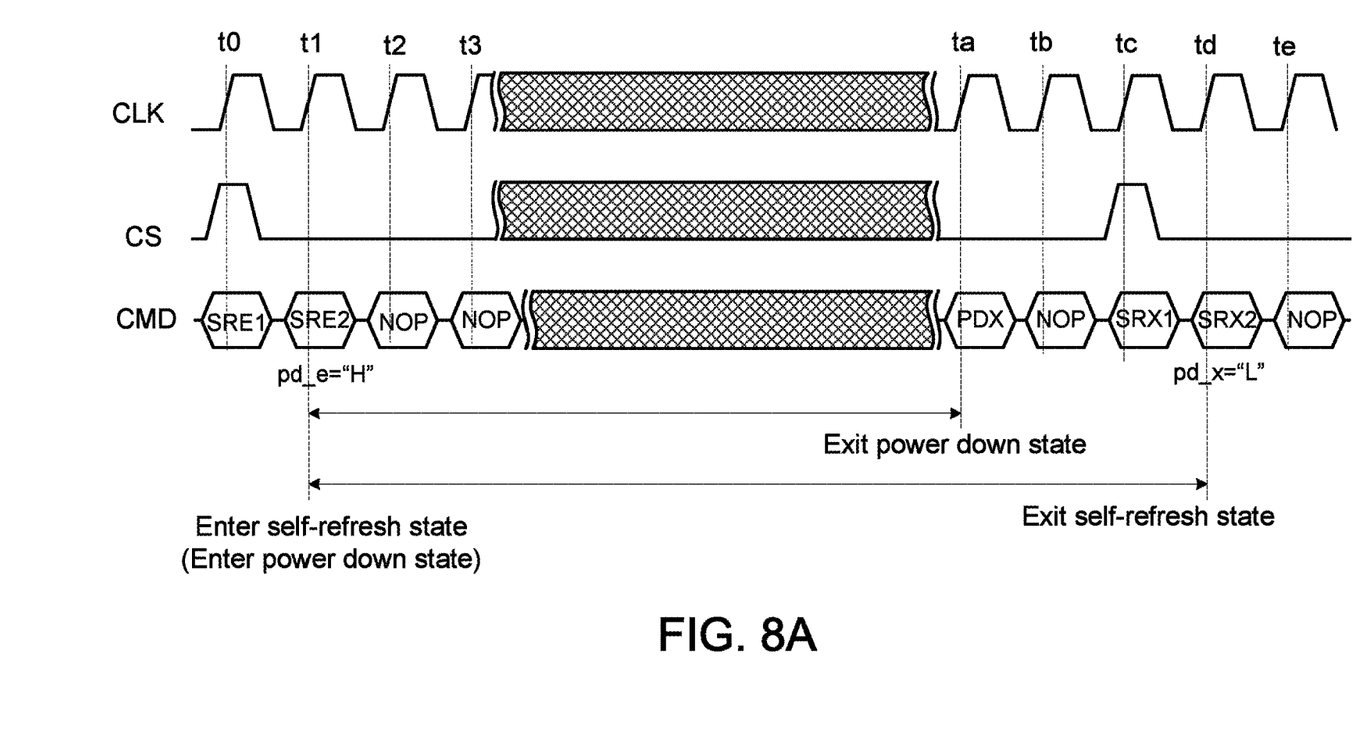
FIG. 8A is a schematic timing waveform diagram illustrating associated signals for controlling the DDR DRAM to enter/exit the power down state according to a third embodiment of the invention.

FIG. 8A is a schematic timing waveform diagram illustrating associated signals for controlling the DDR DRAM to enter/exit the power down state according to a third embodiment of the invention. In response to the rising edge of the clock signal CLK at the time point t0, the memory controller 420 generates the first entering self-refresh command SRE1 when the chip select signal CS is in the high level state. Then, in response to the rising edge of the clock signal CLK at the time point t1, the memory controller 420 generates the second entering self-refresh command SRE2 when the chip select signal CS is in the low level state. Since the power down entry bit pd_e is set as the high level state, the DDR DRAM 410 enters the self-refresh state and the power down state simultaneously at the time point t1.

In response to the rising edge of the clock signal CLK at the time point ta, the memory controller 420 generates the exiting power down command PDX. That is, at the time point ta, the DDR DRAM 410 exits the power down state. Consequently, in the time interval between t1 and ta, the DDR DRAM 410 is in the power down state.

In response to the rising edge of the clock signal CLK at the time point tc, the memory controller 420 generates the first exiting self-refresh command SRX1 when the chip select signal CS is in the high level state. Then, in response to the rising edge of the clock signal CLK at the time point td, the memory controller 420 generates the second exiting self-refresh command SRX2 when the chip select signal CS is in the low level state. Since the power down exit bit pd_x is set as the low level state, the DDR DRAM 410 exits the self-refresh state at the time point td. Consequently, the DDR DRAM 410 is in the self-refresh state in the time interval between t1 and td.

Figure 8B:
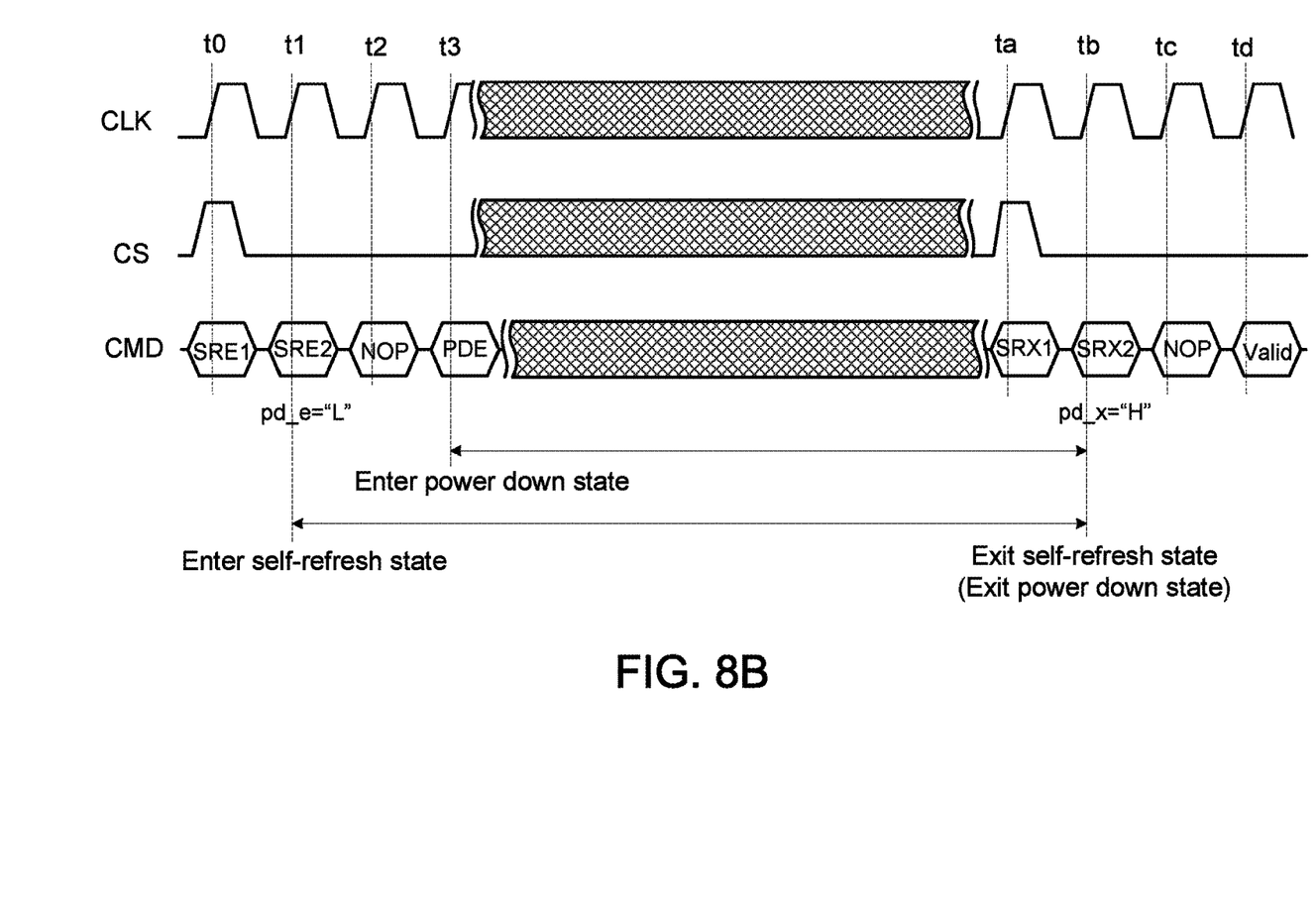
FIG. 8B is a schematic timing waveform diagram illustrating associated signals for controlling the DDR DRAM to enter/exit the power down state according to a fourth embodiment of the invention.

FIG. 8B is a schematic timing waveform diagram illustrating associated signals for controlling the DDR DRAM to enter/exit the power down state according to a fourth embodiment of the invention. In response to the rising edge of the clock signal CLK at the time point t0, the memory controller 420 generates the first entering self-refresh command SRE1 when the chip select signal CS is in the high level state. Then, in response to the rising edge of the clock signal CLK at the time point t1, the memory controller 420 generates the second entering self-refresh command SRE2 when the chip select signal CS is in the low level state. Since the power down entry bit pd_e is set as the low level state, the DDR DRAM 410 enters the self-refresh state at the time point t1.

Moreover, in response to the rising edge of the clock signal CLK at the time point t3, the memory controller 420 generates the entering power down command PDE. That is, at the time point t3, the DDR DRAM 410 enters the power down state.

In response to the rising edge of the clock signal CLK at the time point ta, the memory controller 420 generates the first exiting self-refresh command SRX1 when the chip select signal CS is in the high level state. Then, in response to the rising edge of the clock signal CLK at the time point tb, the memory controller 420 generates the second exiting self-refresh command SRX2 when the chip select signal CS is in the low level state. Since the power down exit bit pd_x is set as the high level state, the DDR DRAM 410 exits the self-refresh state and the power down state simultaneously at the time point tb. Consequently, the DDR DRAM 410 is in the self-refresh state in the time interval between t1 and tb and the DDR DRAM 410 is in the power down state in the time interval between t3 and tb.

Figure 8C:
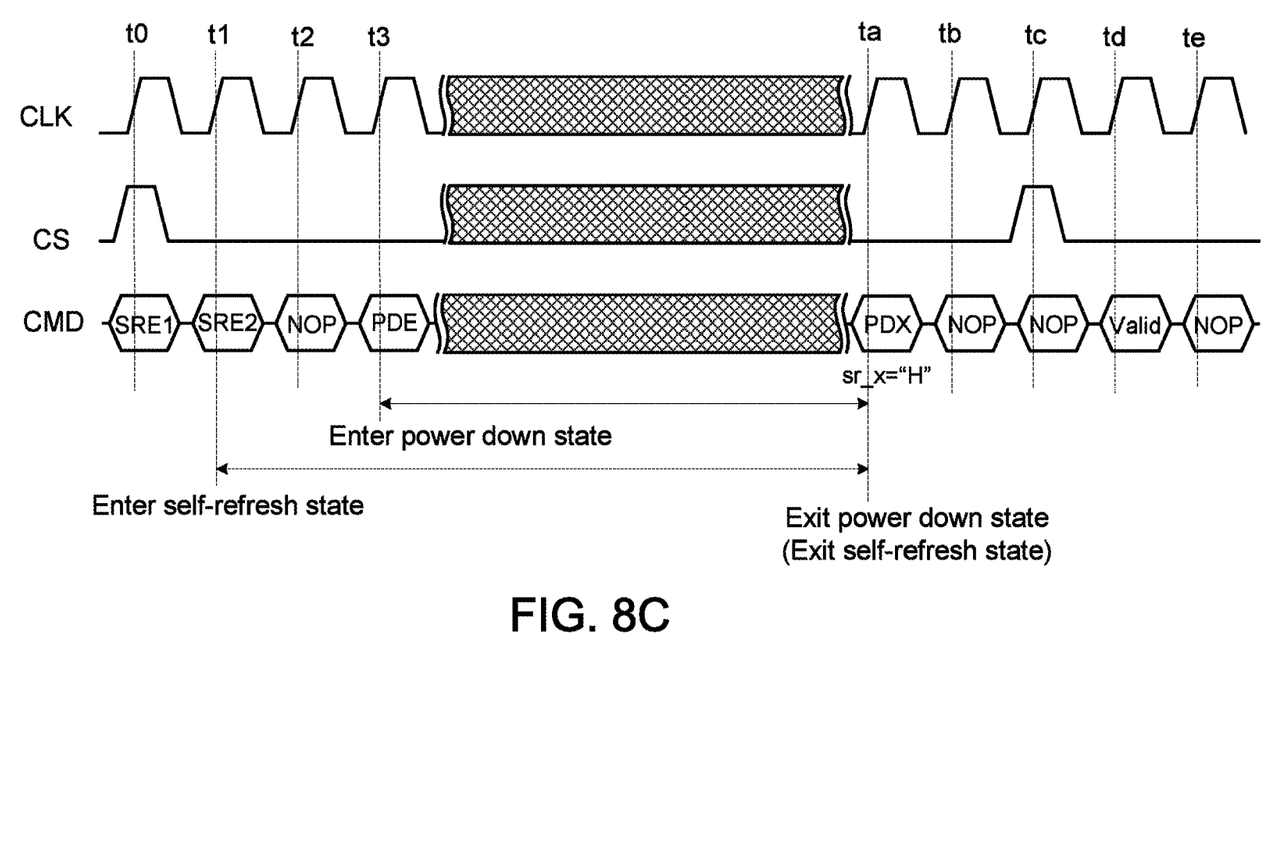
FIG. 8C is a schematic timing waveform diagram illustrating associated signals for controlling the DDR DRAM to enter/exit the power down state according to a fifth embodiment of the invention.

FIG. 8C is a schematic timing waveform diagram illustrating associated signals for controlling the DDR DRAM to enter/exit the power down state according to a fifth embodiment of the invention. In this embodiment, a self-refresh exit bit sr_x is defined in the exiting power down command PDX of the command signal CMD. Alternatively, the self-refresh exit bit sr_x is defined in the mode register 412 of the DDR DRAM 410. While the exiting power down command PDX is executes, the DDR DRAM 410 checks the self-refresh exit bit sr_x. If the self-refresh exit bit sr_x is in the high level state, the DDR DRAM 410 enters the self-refresh state and the power down state simultaneously. Whereas, if the self-refresh exit bit sr_x is in the low level state, the DDR DRAM 410 exits the power down state but does not exit the self-refresh state.

Please refer to FIG. 8C. In response to the rising edge of the clock signal CLK at the time point t0, the memory controller 420 generates the first entering self-refresh command SRE1 when the chip select signal CS is in the high level state. Then, in response to the rising edge of the clock signal CLK at the time point t1, the memory controller 420 generates the second entering self-refresh command SRE2 when the chip select signal CS is in the low level state. That is, the DDR DRAM 410 enters the self-refresh state at the time point t1.

Moreover, in response to the rising edge of the clock signal CLK at the time point t3, the memory controller 420 generates the entering power down command PDE. That is, at the time point t3, the DDR DRAM 410 enters the power down state.

In response to the rising edge of the clock signal CLK at the time point ta, the memory controller 420 generates the exiting power down command PDX. Since the self-refresh exit bit sr_x is in the high level state, the DDR DRAM 410 enters the self-refresh state and the power down state simultaneously. Consequently, the DDR DRAM 410 is in the power down state in the time interval between t3 and ta, and the DDR DRAM 410 is in the self-refresh in the time interval between t1 and ta.

From the above descriptions, the invention provides a memory capable of entering/exiting a power down state during a self-refresh period without using the CKE pin. The invention also provides a memory controller and a memory system associated with the memory. The memory controller is used for controlling the DDR DRAM. Consequently, the DDR DRAM can enter/exit the power down state during the self-refresh period.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory controller connected with a memory, the memory controller comprising:
    a clock signal pin connected with the memory for transmitting a clock signal to the memory; and
    plural command pins connected with the memory for transmitting a command signal to the memory,
    wherein the command signal contains an entering self-refresh command, wherein when the entering self-refresh command is executed, the memory enters a self-refresh state and a power down state simultaneously according to a first level state of a power down entry bit; and
    wherein when the entering self-refresh command is executed, the memory enters the self-refresh state but does not enter the power down state according to a second level state of the power down entry bit.

2. The memory controller as claimed in claim 1, wherein the command signal further contains an exiting self-refresh command and an exiting power down command, wherein the memory exits the self-refresh state when the exiting self-refresh command is executed, and the memory exits the power down state when the exiting power down command is executed.

3. The memory controller as claimed in claim 1, wherein the command signal contains an exiting self-refresh command, wherein when the exiting self-refresh command is executed, the memory exits the self-refresh state and the memory selectively exits the power down state according to a setting of a power down exit bit.

4. The memory controller as claimed in claim 3, wherein the power down entry bit is defined in the entering self-refresh command, or the power down entry bit is defined in a mode register of the memory, wherein the power down exit bit is defined in the exiting self-refresh command, or the power down exit bit is defined in the mode register of the memory.

5. The memory controller as claimed in claim 1, wherein the command signal contains an exiting power down command, wherein when the exiting power down command is executed, the memory exits the power down state and the memory selectively exits the self-refresh state according to a setting of a self-refresh exit bit.

6. The memory controller as claimed in claim 5, wherein the self-refresh exit bit is defined in the exiting power down command, or the self-refresh exit bit is defined in a mode register of the memory.

7. A memory connected with a memory controller, the memory comprising:
    a clock signal pin connected with the memory controller for receiving a clock signal from the memory controller; and
    plural command pins connected with the memory controller for receiving a command signal from the memory controller,
    wherein the command signal contains an entering self-refresh command, wherein when the entering self-refresh command is executed, the memory enters a self-refresh state and a power down state simultaneously according to a first level state of a power down entry bit; and
    wherein when the entering self-refresh command is executed, the memory enters the self-refresh state but does not enter the power down state according to a second level state of the power down entry bit.

8. The memory as claimed in claim 7, wherein the command signal further contains an exiting self-refresh command and an exiting power down command, wherein the memory exits the self-refresh state when the exiting self-refresh command is executed, and the memory exits the power down state when the exiting power down command is executed.

9. The memory as claimed in claim 7, wherein the command signal contains an exiting self-refresh command, wherein when the exiting self-refresh command is executed, the memory exits the self-refresh state and the memory selectively exits the power down state according to a setting of a power down exit bit.

10. The memory as claimed in claim 9, wherein the power down entry bit is defined in the entering self-refresh command, or the power down entry bit is defined in a mode register of the memory, wherein the power down exit bit is defined in the exiting self-refresh command, or the power down exit bit is defined in the mode register of the memory.

11. The memory as claimed in claim 7, wherein the command signal contains an exiting power down command, wherein when the exiting power down command is executed, the memory exits the power down state and the memory selectively exits the self-refresh state according to a setting of a self-refresh exit bit.

12. The memory as claimed in claim 11, wherein the self-refresh exit bit is defined in the exiting power down command, or the self-refresh exit bit is defined in a mode register of the memory.

* * * * *